(12) United States Patent
Spencer et al.

(10) Patent No.: US 7,393,257 B2
(45) Date of Patent: Jul. 1, 2008

(54) SEALING OF ORGANIC THIN-FILM LIGHT-EMITTING DEVICES

(75) Inventors: Timothy F. Spencer, Rochester, NY (US); David R. Strip, Albuquerque, NM (US); Thomas W. Palone, Rochester, NY (US); Erwin L. Allmann, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 418 days.

(21) Appl. No.: 10/987,517

(22) Filed: Nov. 12, 2004

(65) Prior Publication Data

US 2006/0103301 A1    May 18, 2006

(51) Int. Cl.
*H01J 9/00*    (2006.01)

(52) U.S. Cl. ............................. 445/23; 445/25

(58) Field of Classification Search ............. 445/23–25; 65/36, 40, 43, 152, 89, 99
See application file for complete search history.

(56) References Cited

U.S. PATENT DOCUMENTS

| 5,489,321 A | 2/1996 | Tracy et al. |
| 5,693,111 A | 12/1997 | Kadowaki et al. |
| 5,820,435 A | 10/1998 | Cooper et al. |
| 2003/0066311 A1 | 4/2003 | Li et al. |

*Primary Examiner*—Joseph L Williams
(74) *Attorney, Agent, or Firm*—Andrew J. Anderson

(57) ABSTRACT

A method for hermetically sealing an organic thin-film light-emitting device between a substrate and a cover including the steps of bringing the substrate and cover into close proximity at a peripheral side edge of at least one of the substrate or cover, bringing an energy absorbing material into contact with the cover and substrate at the peripheral side edge of at least one of the substrate or cover, and applying energy directly to the energy absorbing material, causing the energy absorbing material to transfer heat to the substrate and the cover to fuse and form a hermetic seal along the peripheral side edge.

18 Claims, 5 Drawing Sheets

SEALING OF ORGANIC THIN-FILM LIGHT-EMITTING DEVICES

FIELD OF THE INVENTION

The present invention relates to the sealing of organic thin-film light-emitting devices such as utilized in flat panel displays or flat panel illumination sources constructed on substrates and more particularly to the welding of the substrates to covers.

BACKGROUND OF THE INVENTION

Organic thin-film light-emitting devices are known to be exquisitely sensitive to water vapor and oxygen. Exposure to either of these materials results in the rapid degradation and failure of the devices, reducing or destroying the utility of the flat panel display or flat panel illumination source utilizing these devices. A number of approaches have been developed to seal the organic thin-film devices to eliminate exposure to oxygen and water vapor. The most commonly used approach in commercial application is to apply an adhesive between the device substrate and an impermeable cover. A variety of means, such as UV exposure, may be used to accelerate the curing of the adhesive. A limitation of this approach is that all known commercially suitable curable adhesive materials provide an inadequate barrier to water vapor, which creates the need to introduce a desiccant between the cover and substrate, increasing costs and complexity. Kadowaki, et al. (U.S. Pat. No. 5,693,111) propose to utilize a laser to create a bond between a substrate glass and cover glass of a display device. This approach suffers from the need to create special glass formulations that allow the laser to pass through one glass layer while being absorbed in the second layer. Furthermore, the cover and substrate glasses must have nearly identical coefficients of thermal expansion to prevent residual stresses from being created in the sealed envelope. The special glass formulations add cost and create problems selecting glasses that are compatible with the sealing process, the process for producing the thin-film organic light-emitting devices, and the optical functionality of the completed device. The method suffers also from the need to leave a margin between the seal and the edge of the cover and substrate glasses. Minimizing the distance from the edge of the active area to the edge of the cover and substrate glasses is often a design goal for the device being produced.

Cooper, et al. (U.S. Pat. No. 5,820,435) discloses providing a means for allowing a small gap to exist between the two glass layers of a flat-panel device. This is useful, e.g., for thin-film organic light-emitting devices, where such a gap between the substrate and cover glass is frequently supplied to prevent degradation of the organic materials. However, this approach still suffers the same limitations relating to glass formulation, functional compatibility, and edge margin.

Tracy, et al. (U.S. Pat. No. 5,489,321) introduce a radiation absorbing material between two adjacent glass plates and then subject the material to radiation that has penetrated one of the two glass plates prior to reaching the radiation absorbing material. While this approach probably creates fewer material compatibility problems, especially in terms of allowing both glass layers to be optically transparent, the method still suffers from limiting material choices. It also creates a new problem—producing the energy absorbing material in the right shape and thickness to match the spacing requirements of the completed device. Since the desired gap is typically on the order of 10-20 microns, producing a wire or other form of radiation absorbing material in this thickness or diameter is quite challenging. Furthermore, the bond width and the spacing between the glass plates can limit the volume of energy absorbing material, and potentially the ultimate bond strength.

Li, et al. (US2003/0066311A1) describe a method for sealing a glass substrate and a glass cap by employing a glass frit in a bonding region between the glass substrate and glass cap. This approach eliminates the need to make one of the glass cover or glass cap be produced from the energy absorbing material, but retains the short-coming that the radiation used to heat the frit bonding material still must pass through one of the glass substrate or glass cap. This method also introduces a new problem in that the frit is produced from glass and a binder. The binder must be baked out prior to assembling the device, introducing a new step. In addition, organic thin-film light-emitting devices are very sensitive to contamination, and even after bake-out, the frit will contain small amounts of binder that will be liberated from the frit and trapped in the sealed envelope, risking damage to the encapsulated device.

All of the processes described above are a form of welding, in which the substrate and cover are fused, either directly to one another, or each is fused to a third component, which is typically referred to as the "filler" in welding. Welding contrasts with soldering, in which a material (the solder) wets the surfaces of the cover and substrate and forms a mechanical junction through this wetting, without melting the cover or substrate. Soldering can be utilized in a style similar to that of the frit, in which the solder is placed in a bonding region between the substrate and cover and is heated by any of a variety of means including radiation and induction. Unlike the welding processes described, soldering can be applied from the edges of the glasses to be sealed and heated directly. The solder is then drawn into the gap by capillary action. The main drawback of soldering methods is the cost of solders compatible with glasses, which tends to be high, and the difficulty of controlling the wicking of the solder between the cover and substrate.

There is a need therefore for an improved sealing method which provides a high quality seal without unduly limiting the choice of materials for the cover and substrate.

SUMMARY OF THE INVENTION

In accordance with one embodiment, the invention is directed towards a method for hermetically sealing an organic thin-film light-emitting device between a substrate and a cover comprising the steps of a) bringing the substrate and cover into close proximity at a peripheral side edge of at least one of the substrate or cover, b) bringing an energy absorbing material into contact with the cover and substrate at the peripheral side edge of at least one of the substrate or cover, and c) applying energy directly to the energy absorbing material, causing the energy absorbing material to transfer heat to the substrate and the cover to fuse and form a hermetic seal along the peripheral side edge.

In accordance with another embodiment, the invention is directed towards a method for hermetically sealing an organic thin-film light-emitting device between a substrate and a cover comprising the steps of a) bringing the substrate and cover into close proximity at a peripheral side edge of at least one of the substrate or cover, b) pre-heating an energy absorbing material and bringing the pre-heated energy absorbing material into contact with the cover and substrate at the peripheral side edge of at least one of the substrate or cover, and c) transferring the heat from the pre-heated energy absorbing material transfers heat to the substrate and the cover to fuse and form a hermetic seal along the peripheral side edge.

In accordance with another embodiment, the invention is directed towards an organic thin-film light-emitting device comprised of at least a cover, a substrate, an organic thin-film light-emitting region between the cover and the substrate, and a fused hermetic edge seal formed on a peripheral side edge of at least one of the cover and substrate.

In accordance with various embodiments, it is an object to produce heat in the bonding material by subjecting it to direct radiation exposure. The energy absorbing material then melts the adjacent portions of both substrate and cover sheets, which flow together to create a welded bond. The invention eliminates the need to pass the directed energy through either the substrate or cover by locating the energy absorbing material along a peripheral side edge of at least one of the substrate or cover. By utilizing an unrestricted path for the applied energy (such as laser, microwave, infrared, conduction, etc), energy absorption or reflection by the substrate or cover plates to be bonded is eliminated. This makes it is possible to use a wider variety of energy sources and wavelengths to supply the required energy to the absorbing material.

It is another object to enable a stronger bond by allowing more bonding material to come in contact with the substrate and cover plates. The energy absorbing material is not constrained to the space between the adjacent plates, but may extend also along the peripheral side edges of one or both plates.

It is still another object to allow flexibility in the manufacturing process by providing the ability to introduce the energy absorbing material to the bond area after the plates have been located in contact with one another. Manufacturing flexibility is further enhanced by the location of the energy absorbing material external to the main surface of the substrate and/or cover plates since this configuration expedites the convection cooling of the system once the weld is completed and introduces the opportunity for conductive cooling.

DETAILED DESCRIPTION OF THE INVENTION

Figure 1:
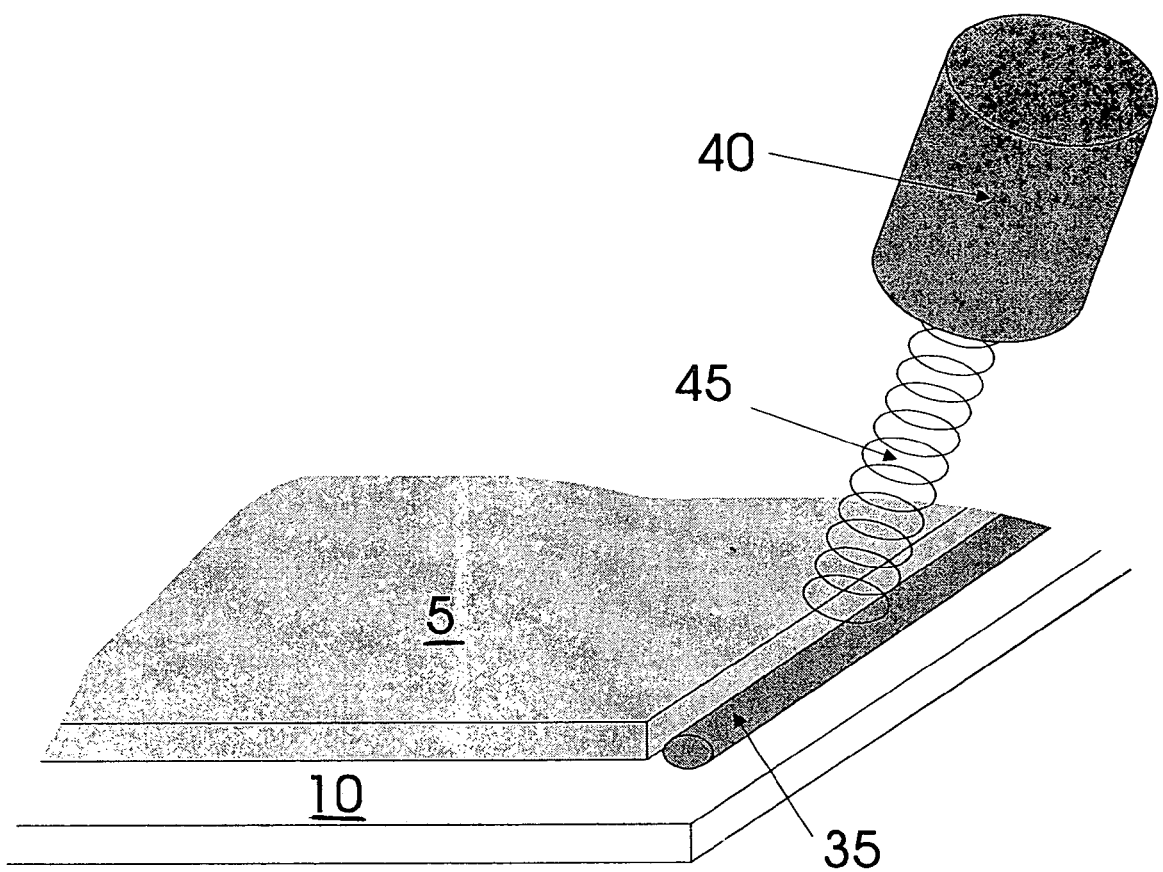
FIG. 1 is a diagram of an organic thin-film light-emitting device sealed according to one embodiment of the invention.

Referring to FIG. 1, a substrate 10 and a cover 5 are welded together by placing an energy absorbing material 35, shown here as a thin rod or fiber, along the junction of the substrate and cover and directly applying energy to the exposed material 35, shown here as the energy beam 45 from a laser 40. In accordance with one embodiment of the invention, the energy absorbing material is positioned along the peripheral side edge of the cover 5, and also in contact with the adjacent main face of substrate 10. The energy absorbing material gets hot and transfers a portion of the heat to the substrate and cover. The energy is applied until the substrate, cover, and energy absorbing material fuse. Depending on the nature of the energy absorbing material, the substrate and cover may fuse directly, they may each fuse to the energy absorbing material, or the energy absorbing material may diffuse into the cover and substrate, which fuse directly to one another.

Figure 2:
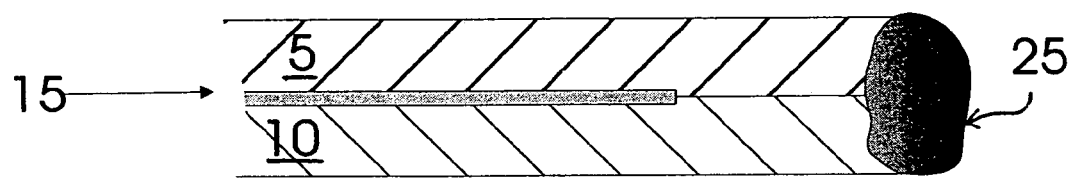
FIG. 2 is a diagram of an organic thin-film light-emitting device sealed according to a second embodiment of the invention.
Figure 3:
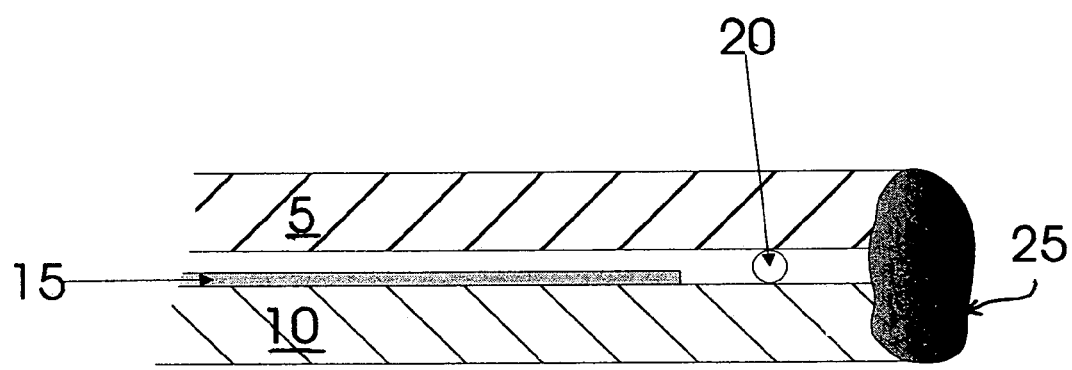
FIG. 3 is a diagram of an organic thin-film light-emitting device sealed according to a third embodiment of the invention.

FIGS. 2-5 illustrate various arrangements of the cover and the substrate. In FIGS. 2-3, the substrate and cover are substantially the same size and are brought into close proximity aligned in a manner such that their peripheral side edges are in substantially coincident positions, and the weld 25 hermetic seal is formed along the peripheral side edges of both of the substrate and the cover. In FIG. 2, the cover 5 is in direct contact with the substrate 10 at the edge where the weld 25 seal is made. An organic thin-film light-emitting device 15 is sandwiched between the cover and the substrate. The film is so thin that contact between the cover and substrate is easily achieved. There are degradation phenomena, however, that suggest it is preferable to maintain a gap between the organic thin-film region and the cover. This can be achieved by placing small beads 20 between the cover and substrate as shown in FIG. 3. The use of small beads is already common in the industry to maintain spacing in an epoxy seal. With the beads in place, the substrate. and cover are not in direct contact. In this case, the energy absorbing material spans the cover and substrate, bonding to both and forming a bridge weld between the two.

Figure 4:
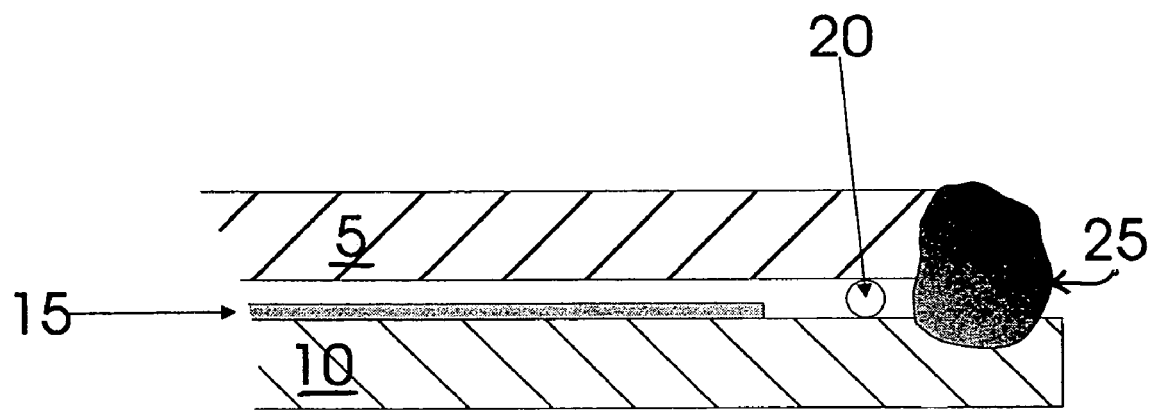
FIG. 4 is a diagram of an organic thin-film light-emitting device sealed according to a fourth embodiment of the invention.

FIG. 4 is an edge view of an arrangement similar to that shown in FIG. 1. In this case, the peripheral edge of substrate 10 extends past the peripheral side edge of cover 5, and the energy absorbing material is placed at the junction and is fused with the cover and substrate to form weld 25. This figure shows a spacer 20 present; alternatively, the two layers may be in intimate contact similarly as shown in FIG. 2.

Figure 5:
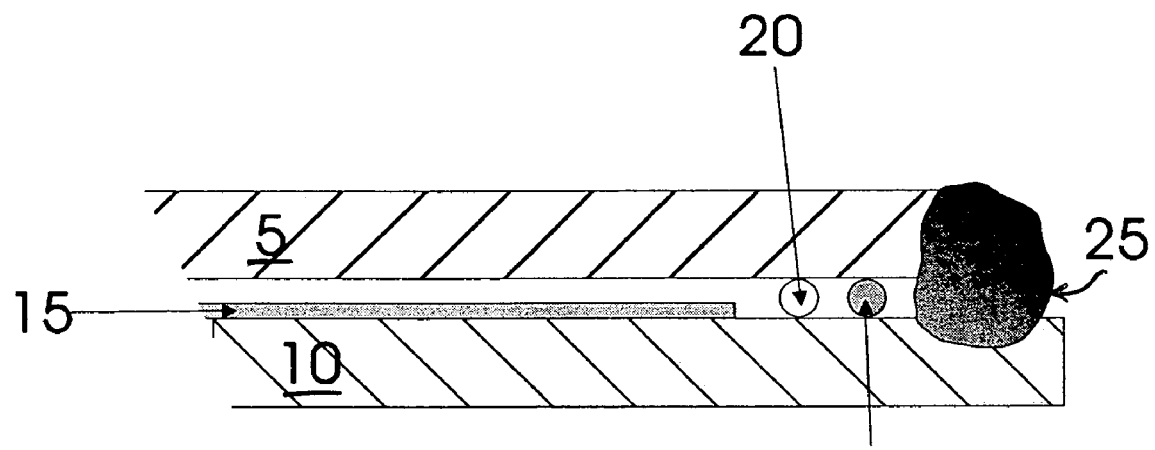
FIG. 5 is a diagram of an organic thin-film light-emitting device sealed according to a fifth embodiment of the invention.

FIG. 5 demonstrates how the invention may be utilized in conjunction with a mechanical seal 30, which itself may not be hermetic. The mechanical seal 30 may be formed first using any of a variety of means well know to practitioners skilled in the art. For example, this seal may be a UV-cured epoxy. In this case, a spacer bead 20 is shown maintaining a gap between the substrate and cover. This process utilizing the mechanical seal may, however, not require such a spacer. There are many reasons why one might wish to provide a mechanical seal in addition to the weld. The equipment for producing the weld may not be easily arrayed in proximity to the production line coating the organic thin-films. In that case, by first sealing with the mechanical seal, we reduce or eliminate the damage that can occur while transporting the sandwiched device. The energy absorbing material may outgas or otherwise emit particles that are harmful to the organic thin-films. The mechanical seal may be adequate to protect against this contamination, while the weld serves as the primary protection against outside environmental elements, such as oxygen and water vapor.

Figure 6:
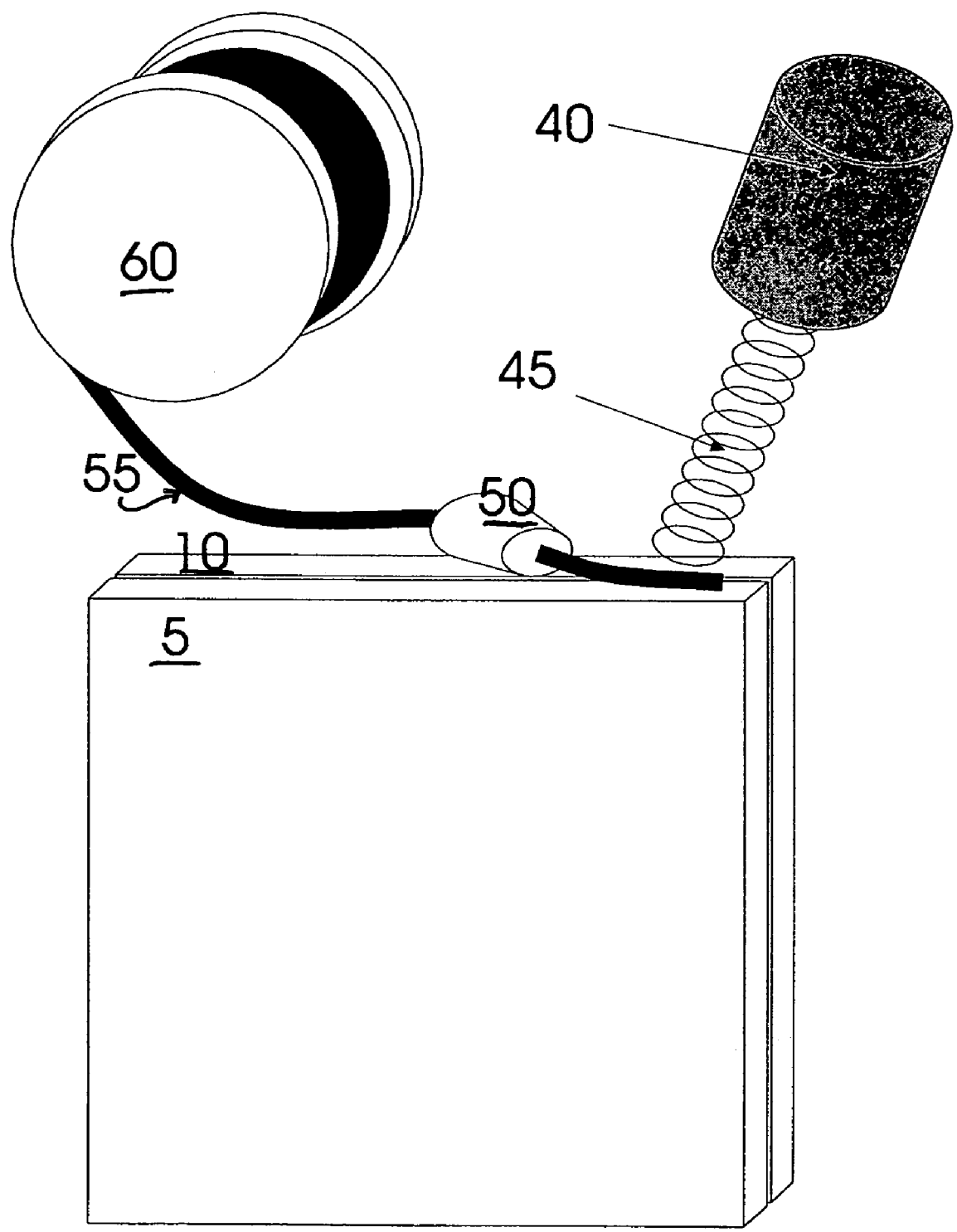
FIG. 6 is a perspective view of a system for performing the welded seal in accordance with one embodiment of this invention.

FIG. 6 illustrates a system for forming continuous welds along the junction of a cover 5 and a substrate 10 which may be used in accordance with an embodiment of the invention. In contrast to the system shown in FIG. 1 which required pieces of energy absorbing material to be individually placed along the junction of the cover and substrate, in this system a continuous flexible solid thread 55 of energy absorbing material is provided on a supply spool 60. This thread is guided by a guidance mechanism, e.g., a nozzle 50, which aligns the thread with the junction between the cover and the substrate 10. As in the system shown in FIG. 1, an external energy source, shown here as a laser 40, emits a beam 45 which heats the thread. This system has many advantages of the system of FIG. 1 in a production environment. This approach is similar in style to TIG welding with a wirefeed for the filler material.

Figure 7:
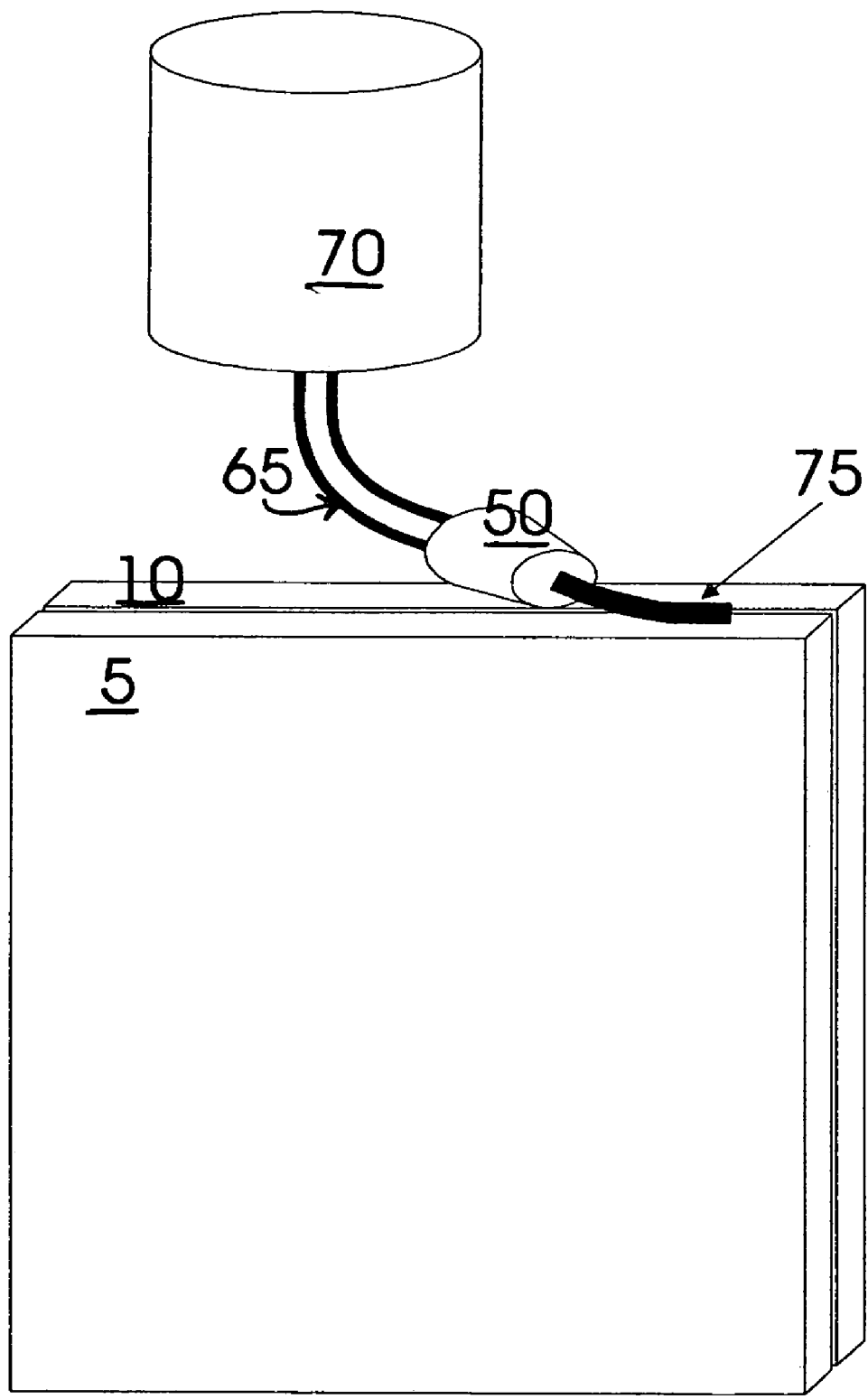
FIG. 7 is a perspective view of a system for performing the welded seam in accordance with another embodiment of this invention.

FIG. 7 illustrates an alternative system for forming continuous welds along the junction of a cover 5 and a substrate 10. In this system, a supply tank 70 contains a supply of highly viscous energy absorbing material. This material is fed through a supply feed 65 to a nozzle 50. The nozzle in this case extrudes a bead 75 of the energy absorbing material along the junction of the substrate and the cover in the form of a highly viscous fluid or paste. The energy absorbing material may be made viscous, e.g., by heating in the supply tank. In this case, the heat carried in the bead of energy absorbing material may be sufficient to melt and fuse the cover and substrate. In an alternative embodiment, the energy absorbing material may be made a viscous fluid by grinding an appropriate solid energy absorbing material and combining it with a liquid which acts as a binder and vehicle for the solid mass. This bead may then be subsequently heated with an energy source, similarly as show in FIG. 6.

The present invention may be employed for forming welds along the junction of covers and substrates of various compositions, e.g., glass, metal, plastic, or layered composites thereof, with selection of appropriate energy absorbing material compatible with the selected cover and substrate compositions. In a particular embodiment, the invention is particularly suitable for forming welds along the junction of glass cover and substrate plates. Energy absorbing materials suitable for use in the present invention for welding glass covers and substrates may be similar to those used in previous disclosed approaches to sealing that require the energy source be transmitted through either the cover glass or the substrate. For example, U.S. Pat. No. 5,489,321, the disclosure of which is incorporated herein by reference, teaches the use of various metal wires such as iron, which are absorptive in the wavelengths of Nd:YAG lasers. The present system can utilize this same absorptive property without the drawbacks inherent in a system that requires transmission of the energy through one of the outer glass layers. Similarly, an energy absorbing glass material, such as taught in U.S. Pat. No. 5,820,435, the disclosure of which is incorporated herein by reference, itself may be used to produce a thin fiber using well-known techniques for drawing glass fibers. This glass fiber may then be used in the system shown in FIG. 6. In addition to the benefits of not having to transmit energy through the cover or substrate, a much smaller amount of the energy absorbing glass material may be required, which may have very high costs due to the requirement to dope the glass material to make it energy absorbing.

The organic thin-film light-emitting device layers 15 may be formed on the substrate 10 by any conventional manufacturing methods prior to encapsulation with cover 5. In a preferred embodiment, the present invention may be employed in a flat-panel OLED display device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST

5 Cover
10 Substrate
15 Organic thin-film light-emitting device
20 Spacer bead
25 Weld
30 Mechanical seal
35 Energy absorbing material
40 Laser
45 Laser beam
50 Nozzle
55 Energy absorbing thread
60 Supply spool
65 Supply feed
70 Supply tank
75 Bead of energy absorbing material

The invention claimed is:

1. A method for hermetically sealing an organic thin-film light-emitting device between a substrate and a cover comprising the steps of
   a) bringing the substrate and cover into close proximity at a peripheral side edge of at least one of the substrate or cover,
   b) bringing an energy absorbing material into contact with the cover and substrate at the peripheral side edge of at least one of the substrate or cover, whereby the energy absorbing material extends along and in contact with the peripheral side edge of at least one of the substrate and cover, and
   c) applying energy directly to the energy absorbing material without first passing the applied energy through the substrate or cover, causing the energy absorbing material to transfer heat to the substrate and the cover to fuse and form a hermetic seal along the peripheral side edge.

2. The method of claim 1 in which the cover and substrate are substantially the same size and brought into close proximity aligned in a manner such that their peripheral side edges are in substantially coincident positions, and the hermetic seal is formed along the peripheral side edges of both of the substrate and the cover.

3. The method of claim 1 in which one of the cover or the substrate is substantially smaller than the other, and the cover and substrate are aligned so that the peripheral side edges of the smaller of the substrate and the cover are interior to the periphery of an adjacent face of the larger of the substrate and the cover, and the hermetic seal is formed along the peripheral side edges of the smaller of the substrate and the cover to the adjacent face of the larger of the substrate and the cover.

4. The method of claim 1 in which the energy is supplied to the energy absorbing material by radiation.

5. The method of claim 4 in which the source of the radiant energy is a laser.

6. The method of claim 1 in which the energy is supplied via inductive heating.

7. The method of claim 1 in which the energy absorbing material is supplied continuously from a supply source and guided into contact position with the peripheral side edge with a guiding mechanism.

8. The method of claim 7 in which the energy absorbing material is supplied as a flexible solid.

9. The method of claim 7 in which the energy absorbing material is supplied as a highly viscous fluid or paste.

10. The method of claim 7 in which the energy absorbing material is pre-heated before it is guided into contact position.

11. The method of claim 7 in which the energy absorbing material is heated at a time substantially after it is guided into contact position.

12. The method of claim 1 in which the cover and substrate are maintained at a fixed spacing by utilizing spacer beads between the substrate and cover.

13. The method of claim 1 in which the cover and substrate are in direct contact.

14. The method of claim 1 in which a mechanical seal is applied between the cover and substrate prior to providing a hermetical seal along the peripheral side edge.

15. The method of claim 1 in which the cover and substrate comprise glass plates.

16. A method for hermetically sealing an organic thin-film light-emitting device between a substrate and a cover comprising the steps of a) bringing the substrate and cover into close proximity at a peripheral side edge of at least one of the substrate or cover, b) pre-heating an energy absorbing material and bringing the pre-heated energy absorbing material into contact with the cover and substrate at the peripheral side edge of at least one of the substrate or cover, whereby the pre-heated energy absorbing material extends along and in contact with the peripheral side edge of at least one of the substrate and cover and c) transferring the heat from the pre-heated energy absorbing material to the substrate and the cover to fuse and form a hermetic seal along the peripheral side edge.

17. The method of claim 16 in which the pre-heated energy absorbing material is extruded into contact with the cover and substrate along the peripheral side edge in the form of a viscous liquid or paste.

18. The method of claim 16 in which the cover and substrate comprise glass plates.

* * * * *